United States Patent
Sugawara

(10) Patent No.: US 7,746,402 B2
(45) Date of Patent: Jun. 29, 2010

(54) IMAGE SENSING DEVICE HAVING A FIBER OPTIC BLOCK TILTED WITH RESPECT TO A LIGHT RECEIVING SURFACE THEREOF

(75) Inventor: Takeo Sugawara, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 1466 days.

(21) Appl. No.: 10/487,417

(22) PCT Filed: Aug. 23, 2002

(86) PCT No.: PCT/JP02/08522

§ 371 (c)(1), (2), (4) Date: Feb. 23, 2004

(87) PCT Pub. No.: WO03/019665

PCT Pub. Date: Mar. 6, 2003

(65) Prior Publication Data

US 2004/0212716 A1 Oct. 28, 2004

(30) Foreign Application Priority Data

Aug. 24, 2001 (JP) .................. 2001-255128

(51) Int. Cl.
H04N 5/225 (2006.01)
(52) U.S. Cl. ........................... 348/340
(58) Field of Classification Search ........ 348/340; 385/116, 120, 119; 257/370.11; 359/341.1
See application file for complete search history.

(56) References Cited

U.S. PATENT DOCUMENTS 4,247,165 A   1/1981 Versluis .................. 350/96.27
4,323,925 A * 4/1982 Abell et al. ................ 348/340
5,329,386 A * 7/1994 Birecki et al. .............. 349/63
5,502,457 A * 3/1996 Sakai et al. ................ 345/87
5,550,380 A * 8/1996 Sugawara et al. ...... 250/370.11
5,818,035 A * 10/1998 Krivanek et al. ........ 250/208.1

(Continued)

FOREIGN PATENT DOCUMENTS

EP    0 803 746 A    10/1997

(Continued)

Primary Examiner—Jason Chan
Assistant Examiner—Gary C Vieaux
(74) Attorney, Agent, or Firm—Drinker Biddle & Reath LLP

(57) ABSTRACT

A fiber optical block 110 having a light outputting end face 112 which is tilted at a predetermined angle θ of an acute angle with respect to the optical axes of optical fibers 113 and a solid-state image pickup device 210 are provided, and the fiber optical block 110 is arranged so that, in terms of a light-receiving surface 212e, the optical axes of the optical fibers 113 are tilted at the predetermined angle θ toward a first side 212a out of four sides 212a-212d. And, in the solid-state image pickup device 210, each of a plurality of electrode pads 211 is provided on two outer peripheral portions 210b and 210d adjacent to the first outer peripheral portion 210a. Thus, an image sensing device which can favorably combine both the electrode pads and connection wires of the solid-state image pickup device and the fiber optical block tilted with respect to the light receiving surface can be realized.

6 Claims, 7 Drawing Sheets

U.S. PATENT DOCUMENTS

| | | | |
|---|---|---|---|
| 5,940,565 A * | 8/1999 | Sugawara | 385/115 |
| 6,038,360 A | 3/2000 | Sugawara | 385/120 |
| 6,479,827 B1 * | 11/2002 | Hamamoto et al. | 250/370.11 |
| 6,635,877 B2 * | 10/2003 | Kusuyama et al. | 250/367 |
| 6,800,836 B2 * | 10/2004 | Hamamoto et al. | 250/208.1 |
| 7,295,736 B2 * | 11/2007 | Sugawara et al. | 385/120 |

FOREIGN PATENT DOCUMENTS

| | | |
|---|---|---|
| EP | 0 813 165 A | 12/1997 |
| JP | 55-13000 | 1/1980 |
| JP | 07-174947 | 7/1995 |
| JP | 7-21877 | 8/1995 |
| JP | 09-326479 | 12/1997 |
| JP | 10-012851 | 1/1998 |
| JP | 2001-78099 | 3/2001 |

* cited by examiner

IMAGE SENSING DEVICE HAVING A FIBER OPTIC BLOCK TILTED WITH RESPECT TO A LIGHT RECEIVING SURFACE THEREOF

FIELD OF THE ART

This invention relates to an image sensing device provided with a fiber optical block.

BACKGROUND ART

As an image sensing device capable of detecting a two-dimensional image (optical image), provided is an image sensing device which directly, optically connects a fiber optical block having a light outputting end face tilted with respect to the optical axes of optical fibers to a light-receiving surface of a solid-state image pickup device. Such an image sensing device has been employed in, for example, a fingerprint detector capable of obtaining a high-quality fingerprint image.

In addition, as image sensing devices which detect a two-dimensional image by an output light from a fiber optical block by use of a solid-state image pickup device, provided are devices as disclosed in, for example, Japanese Patent Application Laid-Open No. H-7-211877, Japanese Patent Application Laid-Open No. H-7-174947, and Japanese Patent Application Laid-Open No. H-10-12851. In such a device, generally, in a solid-state image pickup device with a fiber optical block connected, a plurality of electrode pads are provided on the outer periphery of a light-receiving surface thereof. And, to each of the plurality of electrode pads, a connection wire (bonding wire) is electrically connected.

DISCLOSURE OF THE INVENTION

When a fiber optical block having a light outputting end face tilted with respect to the optical axes of optical fibers is applied to an image sensing device having the above-described construction, the optical axes of an optical fiber in the fiber optical block is tilted with respect to a light-receiving surface to which the light outputting end face is connected. At this time, a problem arises such that favorably combining both the electrode pads and connection wires of the solid-state image pickup device and the fiber optical block tilted with respect to the light-receiving surface is difficult.

Namely, in a case where a sectional shape of the fiber optical block is a parallelogram, when electrode pads arranged on an outer peripheral portion positioned in a tilting direction of the optical axes of the optical fibers with respect to the light-receiving surface are considered, there is a possibility that contact between a slope part of the fiber optical block protruding from the light-receiving surface to the outer peripheral portion and connection wires connected to the electrode pads may result in breaking of the connection wires.

Therefore, in order to avoid contact between the fiber optical block and connection wires, a construction can be considered wherein, by shortening the length of the fiber optical block in the direction to protrude to the outer peripheral portion, the distance between the slope part of the fiber optical block and the electrode pads and connection wires of the solid-state image pickup device is provided with an allowance. However, when the above-described construction is applied, the area of the light outputting end face of the fiber optical block narrows for the light-receiving surface of the solid-state image pickup device. Accordingly, an effective area of the light-receiving surface, which is a region where a light outputted from the fiber optical block is inputted in the light-receiving surface, becomes narrow.

In addition, in a case where a sectional shape of the fiber optical block is a rectangle, an output region where a light inputted from a light inputting end face is outputted and a non-output region where the same is not outputted exist in the light outputting end face. Therefore, if the fiber optical block is arranged, while avoiding the electrode pad provided on the outer periphery of the light-receiving surface, so that the light outputting end face substantially coincides with the light-receiving surface, a light outputted from the fiber optical block is not inputted into the whole light-receiving surface, therefore, an effective region of the light-receiving surface becomes narrow. Thus, it has been difficult to provide the whole light-receiving surface of the solid-state image pickup device as an effective region.

The present invention has been made to solve the above problems and an object thereof is to provide an image sensing device which can favorably combine both the electrode pads and connection wires of the solid-state image pickup device and the fiber optical block tilted with respect to the light-receiving surface.

In order to attain such an object, an image sensing device according to the present invention comprises: (1) a fiber optical block in which a plurality of optical fibers are arrayed so that their optical axes become substantially parallel to each other, which is formed so that a two-dimensional image inputted from a light inputting end face is transmitted to a light outputting end face, and in which the light outputting end face is tilted at a predetermined angle θ of an acute angle with respect to the optical axes; and (2) a solid-state image pickup device having a light-receiving portion with two-dimensional pixel array to whose light-receiving surface the light outputting end face of the fiber optical block is optically connected, and a plurality of electrode pads arranged on a surface identical to the light-receiving surface and on outer peripheral portions thereof, wherein (3) the fiber optical block is arranged so that, when viewed from the light-receiving surface, the optical axes are tilted at the predetermined angle θ toward a first side out of four sides surrounding the light-receiving surface, and each of the plurality of electrode pads is provided on any of three outer peripheral portions excluding a first outer peripheral portion facing the first side.

In an image sensing device of the above-described construction, the light-receiving surface of the solid-state image pickup device and the light outputting end face of the fiber optical block tilted with respect to the optical axes are optically connected. This fiber optical block is arranged so that, when viewed from the light-receiving surface, the optical axes are tilted at a predetermined angle θ toward the first side of the light-receiving surface. Moreover, no electrode pads are provided on a first outer peripheral portion facing the first side. Accordingly, it is possible to favorably combine both the electrode pads and connection wires of the solid-state image pickup device and the fiber optical block tilted with respect to the light-receiving surface.

BEST MODE FOR CARRYING OUT THE INVENTION

Hereinafter, preferred embodiments of an image sensing device according to the present invention will be described in detail with reference to the drawings. Herein, in a description of the drawings, identical symbols will be used for identical elements, whereby repeated description will be omitted. In addition, dimensions and shapes in the respective drawings are not necessarily identical to actual ones.

First Embodiment

Figure 1:
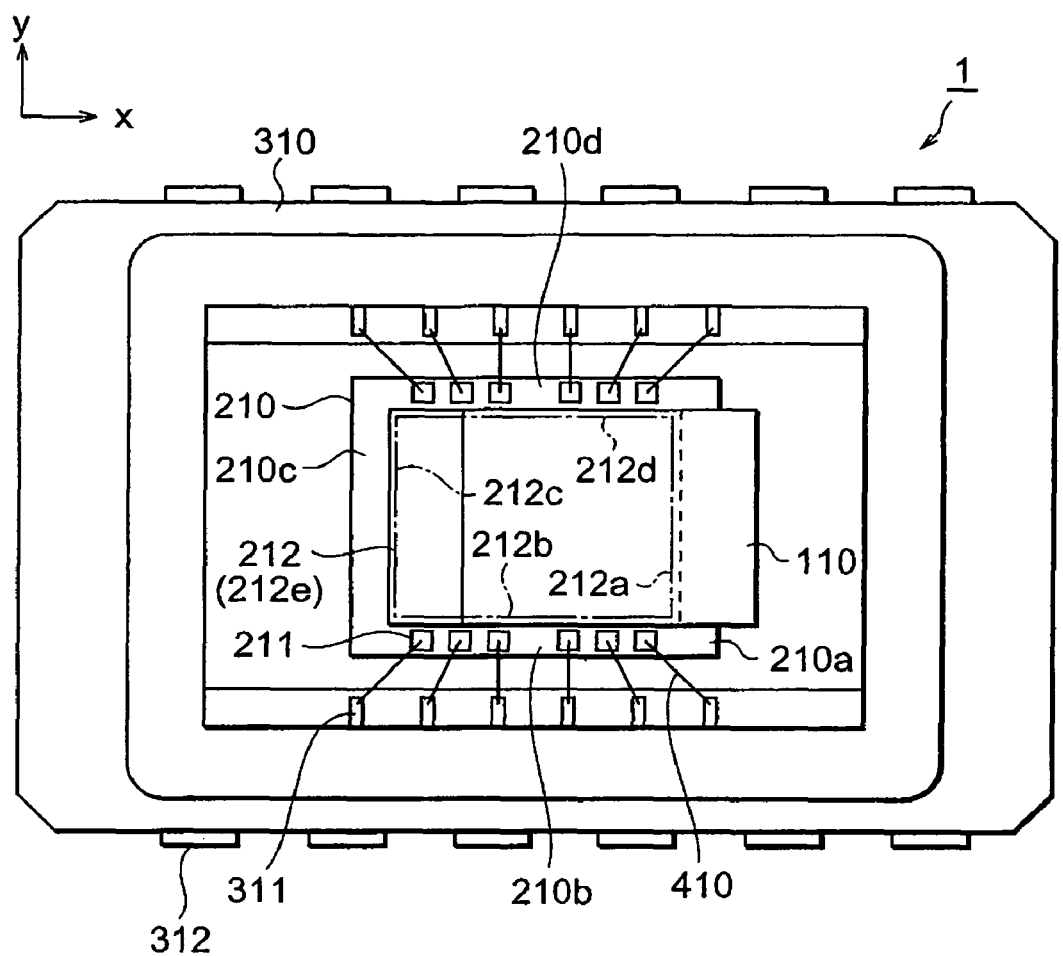
FIG. 1 is a plan view showing an image sensing device according to a first embodiment.
Figure 2:
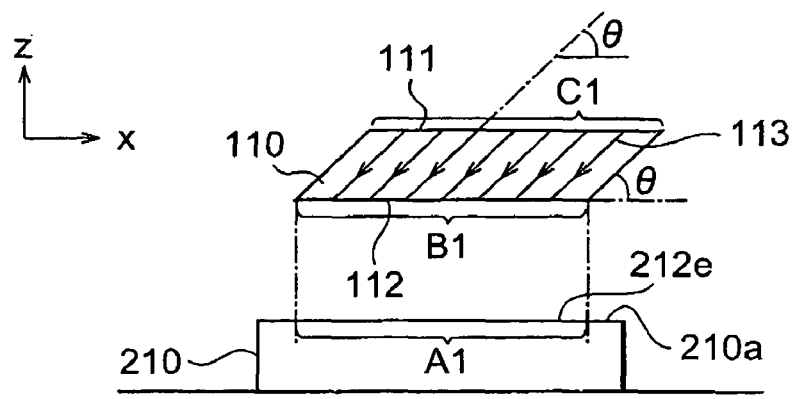
FIG. 2 shows a part of a side sectional view of the image sensing device shown in FIG. 1.

FIG. 1 is a plan view showing an image sensing device according to a first embodiment. In addition, FIG. 2 shows a part of a side sectional view of the image sensing device 1 shown in FIG. 1. Hereinafter, for convenience of description, two mutually perpendicular directions along a pixel array on a light-receiving surface of a solid-state image pickup device are provided as an x-direction and a y-direction, and a vertical direction perpendicular to the x-axis and y-axis is provided as a z-axis direction. The side sectional view of FIG. 2 is a sectional view at an xz-plane viewed from the y-axis direction. In addition, in this FIG. 2, the fiber optical block 110 and solid-state image pickup device 210 to be mutually connected are shown in a manner exploded in the z-axis direction.

The image sensing device 1 according to the present embodiment comprises a fiber optical block 110 and a solid-state image pickup device 210 and is constructed so that a two-dimensional image (two-dimensional optical image) can be detected.

The fiber optical block 110 is formed by integrating a plurality of optical fibers 113 arrayed so that the optical axes become substantially parallel to each other. Thereby, the fiber optical block 110 can transmit a two-dimensional image inputted from one end face to the other end face along the optical axes. In FIG. 1 and FIG. 2, out of the two end faces of the fiber optical block 110, an end face located upward in terms of the z-axis direction is provided as a light inputting end face 111, and an end face located downward and opposed to the light inputting end face 111 is provided as a light outputting end face 112. Moreover, the light inputting end face 111 and light outputting end face 112 both have substantially identically formed rectangular shapes.

In FIG. 2, the oblique lines illustrated in a section of the fiber optical block 110 show tilting directions of the optical axes of the optical fibers 113. The light outputting end face 112 is tilted at a predetermined angle θ of an acute angle with respect to the optical axes of the optical fibers 113. This tilting angle θ is set to 36°, for example. Similarly, the light inputting end face 111 is also tilted at an angle θ with respect to the optical axes of the optical fibers 113, and the light outputting end face 112 and light inputting end face 111 are substantially parallel. In addition, a sectional shape of the fiber optical block 110 viewed from the y-axis direction is, as shown in FIG. 2, a substantially parallelogram shape whose two sides extending from the light outputting end face 112 to the light inputting end face 111 are substantially parallel to the optical axes of the optical fibers 113.

Herein, in a light outputting end face of a fiber optical block, a region where a light inputted from a light inputting end face is outputted is provided as an output region and a region excluding the same where a light inputted from a light inputting end face is not outputted is provided as a non-output region. In the fiber optical block 110 of the present embodiment, because of the above-described sectional shape, in contrast to the whole of the light inputting end face 111 as an input region C1, the whole of the light outputting end face 112 becomes an output region B1.

The solid-state image pickup device 210 has a light-receiving portion 212 with a light-receiving surface 212e of a rectangular shape, and with pixels two-dimensionally arrayed along the x-axis direction and y-axis direction. In FIG. 1, the part shown at an upper-surface side of the solid-state image pickup device 210 by alternative long and short dash lines is the light-receiving surface 212e. At parts in a surface identical to the light-receiving surface 212e and on its outer periphery, a plurality of electrode pads 211 for inputting and outputting signals with respect to respective portions of the solid-state image pickup device 210 such as a light-receiving portion 212 are provided. Then, the respective portions of the solid-state image pickup device 210 are electrically connected to their respectively corresponding electrode pads 211 by signal lines (unillustrated). In addition, to the light-receiving surface 212e, the above-described light outputting end face 112 of the fiber optical block 110 is optically connected.

The solid-state image pickup device 210, to which the fiber optical block 110 is connected, is placed on a substrate 310. On the substrate 310, at predetermined positions on an outer peripheral side of a surface where the solid-state image pickup device 210 is to be placed, a plurality of internal electrode terminals 311 respectively corresponding to the electrode pads 211 of the solid-state image pickup device 210 are arranged. These internal electrode terminals 311 are electrically connected to external electrode terminals 312 for external connection, which are arranged on side surfaces of the substrate 310, by internal wirings (unillustrated) through the substrate 310. Then, the solid-state image pickup device 210 is placed on the substrate 310 so that the respectively corresponding electrode pads 211 and internal electrode terminals 311 are close together. In addition, each of the mutually corresponding electrode pads 211 and internal electrode terminals 311 is electrically connected by a connection wire 410.

A connecting relationship between the fiber optical block 110 and solid-state image pickup device 210 in the image sensing device shown in FIG. 1 will be described. The light-receiving surface 212e of the solid-state image pickup device 210 is surrounded by four sides of two sides 212a and 212c which are parallel to the y-axis and opposed in the x-axis direction and two sides 212b and 212d which are parallel to the x-axis and opposed in the y-axis direction. Then, the fiber optical block 110 is arranged so that, when viewed from the light-receiving surface 212e, the optical axes of the optical fibers 113 are tilted at the aforementioned angle θ toward the side 212a (first side) out of the four sides 212a-212d. Thereby, a tilting direction of the optical axes of the fiber optical block 110 is in a positive direction of the x-axis. Then, in the solid-state image pickup device 210, each of the plurality of electrode pads 211 is arranged on two outer peripheral portions 210b and 210d adjacent to a first outer peripheral portion 210a facing the side 212a.

Moreover, the light outputting end face 112 of the fiber optical block 110 and the light-receiving surface 212e of the solid-state image pickup device 210 have in either case a rectangular shape as mentioned above, and these are substantially identically formed to each other. The light outputting end face 112 and light-receiving surface 212e are connected so that their surfaces substantially coincide with each other. Herein, in the light-receiving surface of a solid-state image pickup device, a region to which an output region in a light outputting end face of a fiber optical block is connected is provided as an effective region, and a region excluding the same is provided as an insensitive region. In the present embodiment, because of the above-described construction, a whole region A1 of the light-receiving surface 212e becomes an effective region.

In the image sensing device 1 of the above constructions, a two-dimensional image inputted from the light inputting end face 111 is transmitted to the light outputting end face 112 along the optical axes of the optical fibers 113. Then, the two-dimensional image outputted from the whole of the light outputting end face 112 as an output region is inputted from the light-receiving surface 212e of the solid-state image pickup device 210 into the light-receiving portion 212 and is detected at the respective pixels of the light-receiving portion 212. Obtained detection signals are outputted, through the outputting electrode pads 211, connection wires 410, and internal electrode terminals 311, from the external electrode terminals 312.

Thus, in the image sensing device 1 according to the present embodiment, each of the plurality of electrode pads 211 arranged on the outer periphery of the light-receiving portion 212 is provided not on the first outer peripheral portion 210a positioned in the tilting direction of the optical axes of the optical fibers 113, but on the mutually opposed two outer peripheral portions 210b and 210d adjacent to the outer peripheral portion 210a. By providing such a construction, the tilting direction of the optical axes of the optical fibers 113 and the direction in which the electrode pads 211 are arrayed result in an identical direction. Thereby, it becomes possible to favorably combine both the electrode pads 211 and connection wires 410 of the solid-state image pickup device 210 and the fiber optical block 110 tilted with respect to the light-receiving surface 212e.

Namely, by applying the above-described construction to the fiber optical block 110 whose sectional shape is a parallelogram, contact of the slope part of the fiber optical block 110 protruding from the light-receiving surface 212e to the outer peripheral portion 210a with the connection wires 410 can be avoided. In addition, it is possible to enlarge the effective region A1 of the light-receiving surface 212e.

Figure 3:
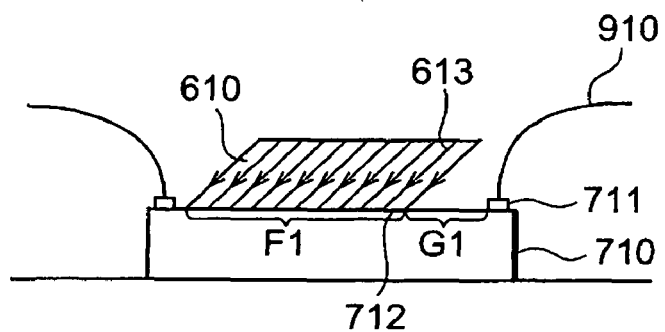
FIG. 3 is a side sectional view of a conventional image sensing device.

Herein, the image sensing device 1 of the present embodiment and a conventional image sensing device will be described by comparison. FIG. 3 is a side sectional view of a conventional image sensing device. In the image sensing device shown in FIG. 3, unlike the image sensing device 1 shown in FIG. 1 and FIG. 2, electrode pads 711 are arrayed, in a solid-state image pickup device 710, on an outer peripheral portion positioned in a direction in which the optical axes of the optical fibers 613 of a fiber optical block 610 are tilted. In this case, there is a possibility that contact between a slope part of the fiber optical block 610 protruding from a light-receiving portion 712 to the outer peripheral portion and connection wires 910 may result in breaking of the connection wires 910. In addition, if contact with the connection wire 910 is avoided by shortening the length of the fiber optical block 610 in the direction to protrude to the outer peripheral portion, an insensitive region G1 of the light-receiving surface 712 enlarges, therefore, an effective area F1 of the light-receiving surface narrows.

In contrast thereto, since the image sensing device 1 according to the present embodiment employs a construction wherein no electrode pads 211 are provided on the outer peripheral portion 210a positioned in the tilting direction of the optical axes of the optical fibers 113, contact between the fiber optical block 110 and connection wires 410 can be avoided. Moreover, since there is no necessity for shortening the length of the fiber optical block 110 in the direction to protrude to the outer peripheral portion 210a so as to avoid contact with the connection wires 410, the effective region A1 of the light-receiving surface 212e of the light-receiving portion 212 can be enlarged.

Second Embodiment

Figure 4:
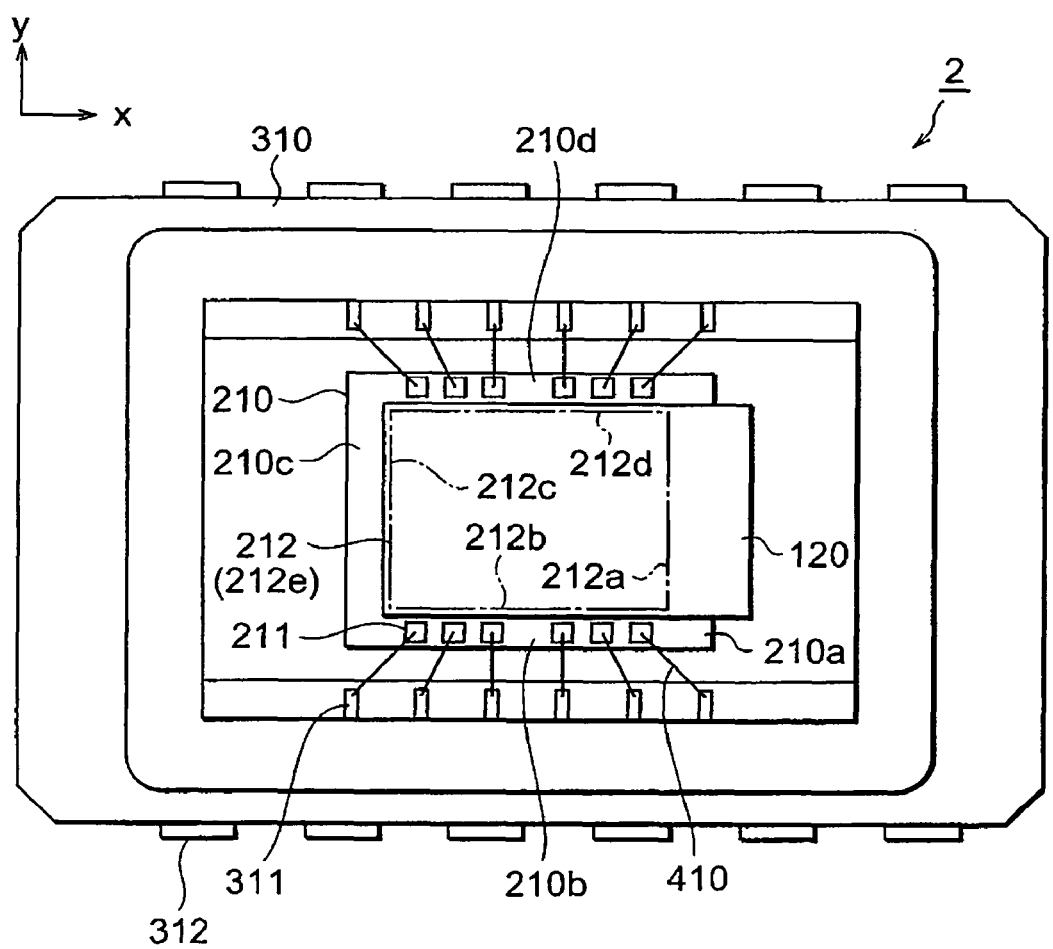
FIG. 4 is a plan view showing an image sensing device according to a second embodiment.
Figure 5:
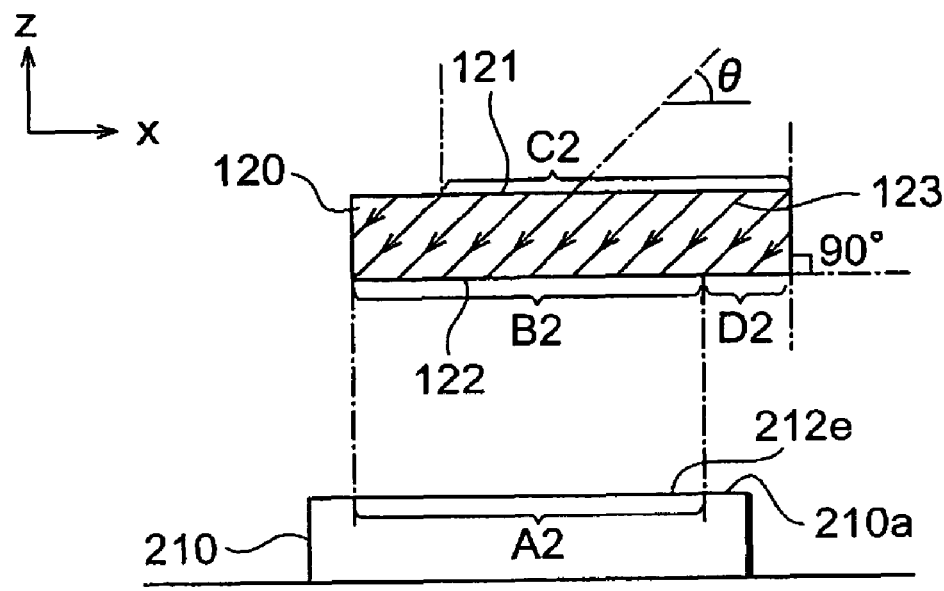
FIG. 5 shows a part of a side sectional view of the image sensing device shown in FIG. 4.

FIG. 4 is a plan view showing an image sensing device according to a second embodiment. In addition, FIG. 5 shows a part of a side sectional view of the image sensing device 2 shown in FIG. 4. The side sectional view of FIG. 5 is a sectional view at an xz-plane viewed from the y-axis direction. In addition, in this FIG. 5, a fiber optical block 120 and a solid-state image pickup device 210 to be mutually connected are shown in a manner exploded in the z-axis direction.

The image sensing device 2 shown in FIG. 4 comprises the fiber optical block 120, the solid-state image pickup device 210, a substrate 310, and connection wires 410. Among these, constructions of the solid-state image pickup device 210, substrate 310, and connection wires 410 are similar to those of the first embodiment.

The fiber optical block 120 is formed by integrating a plurality of optical fibers 123 arrayed so that the optical axes become substantially parallel to each other. Thereby, the fiber optical block 120 can transmit a two-dimensional image inputted from one end face to the other end face along the optical axes. In FIG. 4 and FIG. 5, out of the two end faces of the fiber optical block 120, an end face located upward in terms of the z-axis direction is provided as a light inputting end face 121, and an end face located downward and opposed to the light inputting end face 121 is provided as a light outputting end face 122. Moreover, the light inputting end face 121 and light outputting end face 122 both have substantially identically formed rectangular shapes.

In FIG. 5, the oblique lines illustrated in a section of the fiber optical block 120 show tilting directions of the optical axes of the optical fibers 123. The light outputting end face 122 is tilted at a predetermined angle θ of an acute angle with respect to the optical axes of the optical fibers 123. Similarly, the light inputting end face 121 is also tilted at an angle θ with respect to the optical axes of the optical fibers 123, and the light outputting end face 122 and light inputting end face 121 are substantially parallel. In addition, a sectional shape of the fiber optical block 120 viewed from the y-axis direction is, as shown in FIG. 5, a substantially rectangular shape whose two sides extending from the light outputting end face 122 to the light inputting end face 121 are substantially vertical to the light outputting end face 122.

In the fiber optical block 120 of the present embodiment, because of the above-described sectional shape, in the light inputting end face 121, a partial region where a light to be transmitted to the light outputting end face 122 is inputted is an input region C2. In addition, in the light outputting end face 122, a partial region where a light inputted from the input region C2 is outputted is an output region B2, and a region excepting the same is a non-output region D2. The input region C2 and output region B2 have rectangular shapes substantially identically formed to each other.

A connecting relationship between the fiber optical block 120 and solid-state image pickup device 210 in the image sensing device 2 shown in FIG. 4 will be described. A light-receiving surface 212e of the solid-state image pickup device 210 is surrounded by four sides of two sides 212a and 212c which are parallel to the y-axis and opposed in the x-axis direction and two sides 212b and 212d which are parallel to the x-axis and opposed in the y-axis direction. Then, the fiber optical block 120 is arranged so that, when viewed from the light-receiving surface 212e, the optical axes of the optical fibers 123 are tilted at the aforementioned angle θ toward the side 212a out of the four sides 212a-212d. Thereby, a tilting direction of the optical axes of the fiber optical block 120 is in a positive direction of the x-axis. Then, in the solid-state image pickup device 210, each of a plurality of electrode pads 211 is arranged on two outer peripheral portions 210b and 210d adjacent to a first outer peripheral portion 210a facing the side 212a.

Moreover, the output region B2 in the light outputting end face 122 of the fiber optical block 120 and the light-receiving surface 212e of the solid-state image pickup device 210 have in either case a rectangular shape as mentioned above, and these are substantially identically formed to each other. The output region B2 of the light outputting end face 122 and light-receiving surface 212e are connected so that their surfaces substantially coincide with each other. Thereby, a part on the side of the side 212a of the fiber optical block 120 including the non-output region D2 of the light outputting end face 122 is protruded from above the light-receiving portion 212 toward the outer peripheral portion 210a side. In the present embodiment, because of the above-described construction, a whole region A2 of the light-receiving surface 212e becomes an effective region.

In the image sensing device 2 of the above constructions, a two-dimensional image inputted from the input region C2 of the light inputting end face 121 is transmitted to the output region B2 of the light outputting end face 122 along the optical axes of the optical fibers 123. Then, the two-dimensional image outputted from the output region B2 of a part of the light outputting end face 122 is inputted from the light-receiving surface 212e of the solid-state image pickup device 210 into the light-receiving portion 212 and is detected at the respective pixels of the light-receiving portion 212. Obtained detection signals are outputted, through the outputting electrode pads 211, connection wires 410, and internal electrode terminals 311, from the external electrode terminals 312.

Thus, in the image sensing device 2 according to the present embodiment, each of the plurality of electrode pads 211 arranged on the outer periphery of the light-receiving portion 212 is provided not on the first outer peripheral portion 210a positioned in the tilting direction of the optical axes of the optical fibers 123, but on the mutually opposed two outer peripheral portions 210b and 210d adjacent to the outer peripheral portion 210a. Then, the surfaces of the is output region B2 and light-receiving surface 212e are connected so as to substantially coincide with each other, thus resulting in a construction wherein the non-output region D2 is protruded to the outer peripheral portion 210a of the light-receiving portion 212. Thereby, it becomes possible to favorably combine both the electrode pads 211 and connection wires 410 of the solid-state image pickup device 210 and the fiber optical block 120 tilted with respect to the light-receiving surface 212e.

Namely, by applying the above-described construction to the fiber optical block 120 whose sectional shape is a rectangle, it becomes possible to enlarge the effective region A2 of the light-receiving surface 212e.

Figure 6:
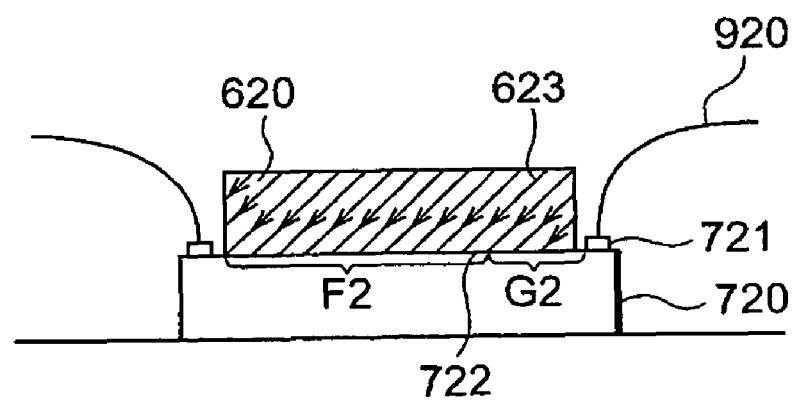
FIG. 6 is a side sectional view of a conventional image sensing device.

Herein, the image sensing device 2 of the present embodiment and a conventional image sensing device will be described by comparison. FIG. 6 is a side sectional view of a conventional image sensing device. In the image sensing device shown in FIG. 6, unlike the image sensing device 2 shown in FIG. 4 and FIG. 5, electrode pads 721 are arrayed, in a solid-state image pickup device 720, on an outer peripheral portion positioned in a direction in which the optical axes of the optical fibers 623 of a fiber optical block 620 are tilted. In this case, in a light-receiving surface 722, a region to which an output region in a light outputting end face of the fiber optical block 620 is connected is provided as an effective region F2, and a region to which a non-output region is connected is provided as an insensitive region G2. Accordingly, a light outputted from the fiber optical block 620 is not inputted into the whole light-receiving surface 722, therefore, an effective region F2 of the light-receiving surface 722 becomes narrow.

In contrast thereto, since the image sensing device 2 according to the present embodiment employs a construction wherein no electrode pads 211 are provided on the outer peripheral portion 210a positioned in the tilting direction of the optical axes of the optical fibers 123, it becomes possible to employ a construction wherein the fiber optical block 120 is protruded toward the outer peripheral portion 210a side, therefore, the effective region A2 of the light-receiving surface 212e of the light-receiving portion 212 can be enlarged.

Third Embodiment

Figure 7:
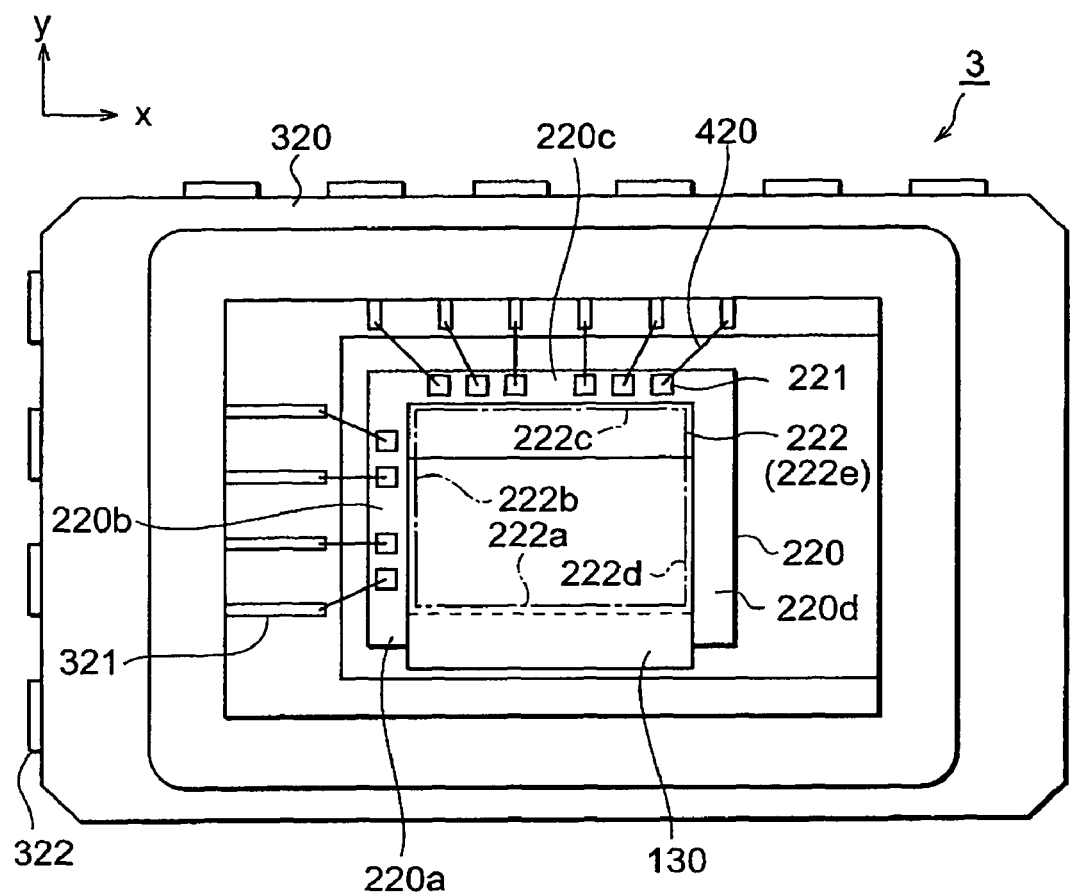
FIG. 7 is a plan view showing an image sensing device according to a third embodiment.
Figure 8:
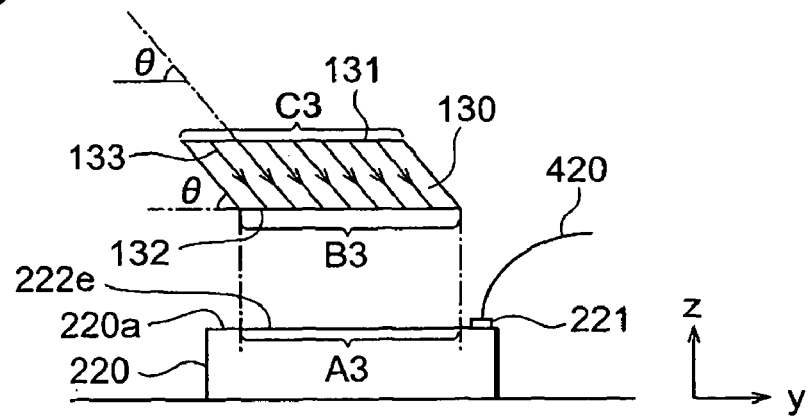
FIG. 8 shows a part of a side sectional view of the image sensing device shown in FIG. 7.

FIG. 7 is a plan view showing an image sensing device according to a third embodiment. In addition, FIG. 8 shows a part of a side sectional view of the image sensing device 3 shown in FIG. 7. The side sectional view of FIG. 8 is a sectional view at a yz-plane viewed from the x-axis direction. In addition, in this FIG. 8, the fiber optical block 130 and solid-state image pickup device 220 to be mutually connected are shown in a manner exploded in the z-axis direction.

The image sensing device 3 according to the present embodiment comprises a fiber optical block 130 and a solid-state image pickup device 220 and is constructed so that a two-dimensional image can be detected.

The fiber optical block 130 is formed by integrating a plurality of optical fibers 133 arrayed so that the optical axes become substantially parallel to each other. Thereby, the fiber optical block 130 can transmit a two-dimensional image inputted from one end face to the other end face along the optical axes. In FIG. 7 and FIG. 8, out of the two end faces of the fiber optical block 130, an end face located upward in terms of the z-axis direction is provided as a light inputting end face 131, and an end face located downward and opposed to the light inputting end face 131 is provided as a light outputting end face 132. Moreover, the light inputting end face 131 and light outputting end face 132 both have substantially identically formed rectangular shapes.

In FIG. 8, the oblique lines illustrated in a section of the fiber optical block 130 show tilting directions of the optical axes of the optical fibers 133. The light outputting end face 132 is tilted at a predetermined angle θ of an acute angle with respect to the optical axes of the optical fibers 133. Similarly, the light inputting end face 131 is also tilted at an angle θ with respect to the optical axes of the optical fibers 133, and the light outputting end face 132 and light inputting end face 131 are substantially parallel. In addition, a sectional shape of the fiber optical block 130 viewed from the x-axis direction is, as shown in FIG. 8, a substantially parallelogram shape whose two sides extending from the light outputting end face 132 to the light inputting end face 131 are substantially parallel to the optical axes of the optical fibers 133.

In the fiber optical block 130 of the present embodiment, because of the above-described sectional shape, in contrast to the whole of the light inputting end face 131 as an input region C3, the whole of the light outputting end face 132 becomes an output region B3.

The solid-state image pickup device 220 has a light-receiving portion 222 with a light-receiving surface 222e of a rectangular shape, and with pixels two-dimensionally arrayed along the x-axis direction and y-axis direction. At parts in a surface identical to the light-receiving surface 222e and on its outer periphery, a plurality of electrode pads 221 are provided. Then, the respective portions of the solid-state image pickup device 220 are electrically connected to their respectively corresponding electrode pads 221 by signal lines (unillustrated). In addition, to the light-receiving surface 222e, the above-described light outputting end face 132 of the fiber optical block 130 is optically connected.

The solid-state image pickup device 220, to which the fiber optical block 130 is connected, is placed on a substrate 320. On the substrate 320, at predetermined positions on an outer peripheral side of a surface where the solid-state image pickup device 220 is to be placed, a plurality of internal electrode terminals 321 respectively corresponding to the electrode pads 221 of the solid-state image pickup device 220 are arranged. These internal electrode terminals 321 are electrically connected to external electrode terminals 322 for external connection, which are arranged on side surfaces of the substrate 320, by internal wirings (unillustrated) through the substrate 320. Then, the solid-state image pickup device 220 is placed on the substrate 320 so that the respectively corresponding electrode pads 221 and internal electrode terminals 321 are close together. In addition, each of the mutually corresponding electrode pads 221 and internal electrode terminals 321 is electrically connected by a connection wire 420.

A connecting relationship between the fiber optical block 130 and solid-state image pickup device 220 in the image sensing device 3 shown in FIG. 7 will be described. The light-receiving surface 222e of the solid-state image pickup device 220 is surrounded by four sides of two sides 222a and 222c which are parallel to the x-axis and opposed in the y-axis direction and two sides 222b and 222d which are parallel to the y-axis and opposed in the x-axis direction. Then, the fiber optical block 130 is arranged so that, when viewed from the light-receiving surface 222e, the optical axes of the optical fibers 133 are tilted at the aforementioned angle θ toward the side 222a out of the four sides 222a-222d. Thereby, a tilting direction of the optical axes of the fiber optical block 130 is in a negative direction of the y-axis. Then, in the solid-state image pickup device 220, each of the plurality of electrode pads 221 is arranged on an outer peripheral portion 220b adjacent to a first outer peripheral portion 220a facing the side 222a, and on an outer peripheral portion 220c opposed to the first outer peripheral portion 220a.

Moreover, the light outputting end face 132 of the fiber optical block 130 and the light-receiving surface 222e of the solid-state image pickup device 220 have in either case a rectangular shape as mentioned above, and these are substantially identically formed to each other. The light outputting end face 132 and light-receiving surface 222e are connected so that their surfaces substantially coincide with each other. In the present embodiment, because of the above-described construction, a whole region A3 of the light-receiving surface 222e becomes an effective region.

Thus, in the image sensing device 3 according to the present embodiment, each of the plurality of electrode pads 221 arranged on the outer periphery of the light-receiving portion 222 is provided not on the first outer peripheral portion 220a positioned in the tilting direction of the optical axes of the optical fibers 133, but on an outer peripheral portion 220b adjacent to the outer peripheral portion 220a and an outer peripheral portion 220c opposed to the outer peripheral portion 220a. Thereby, it becomes possible to favorably combine both the electrode pads 221 and connection wires 420 of the solid-state image pickup device 220 and the fiber optical block 130 tilted with respect to the light-receiving surface 222e.

Namely, by applying the above-described construction to the fiber optical block 130 whose sectional shape is a parallelogram, contact of the slope part of the fiber optical block 130 protruding from the light-receiving surface 222e to the outer peripheral portion 220a with the connection wires 420 can be avoided. In addition, it is possible to enlarge the effective region A3 of the light-receiving surface 222e.

Fourth Embodiment

Figure 9:
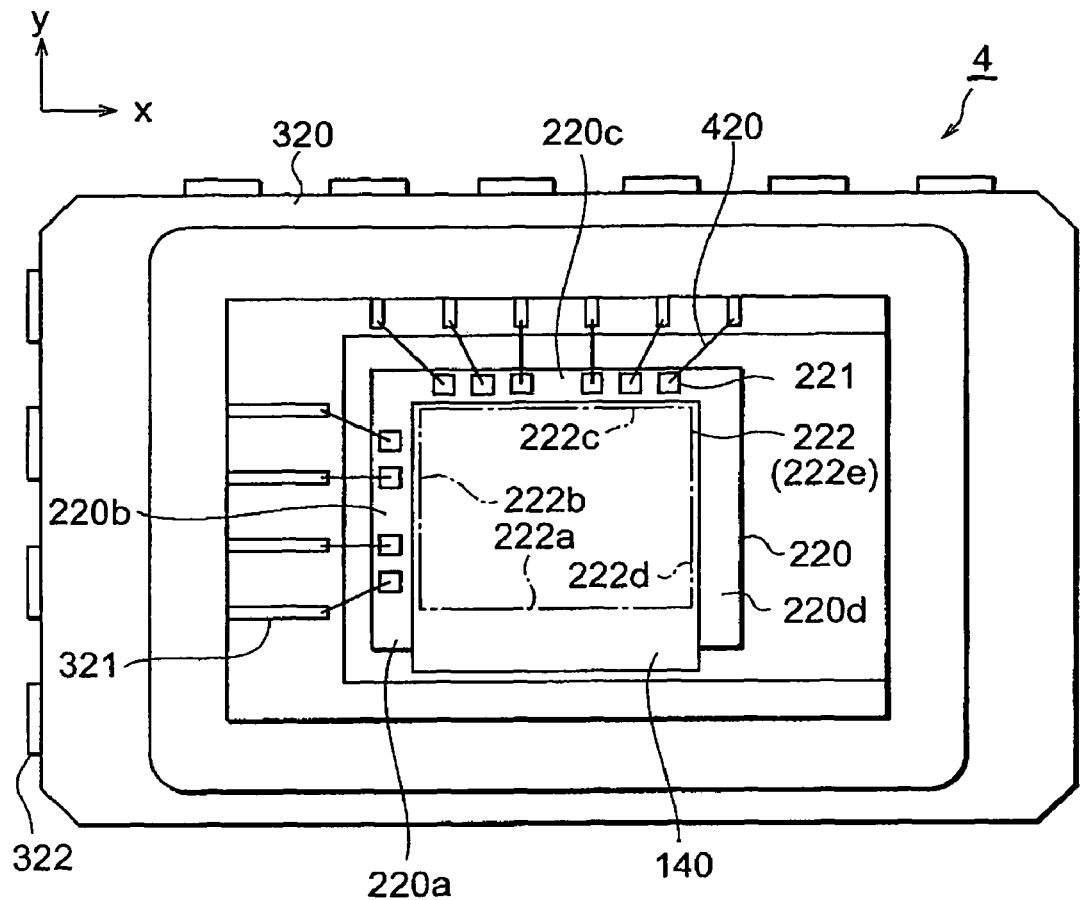
FIG. 9 is a plan view showing an image sensing device according to a fourth embodiment.
Figure 10:
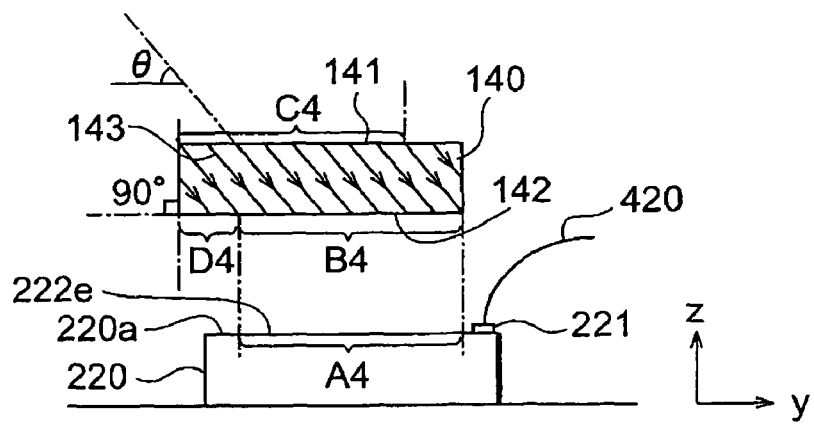
FIG. 10 shows a part of a side sectional view of the image sensing device shown in FIG. 9.

FIG. 9 is a plan view showing an image sensing device according to a fourth embodiment. In addition, FIG. 10 shows a part of a side sectional view of the image sensing device 4 shown in FIG. 9. The side sectional view of FIG. 10 is a sectional view at a yz-plane viewed from the x-axis direction. In addition, in this FIG. 10, a fiber optical block 140 and a solid-state image pickup device 220 to be mutually connected are shown in a manner exploded in the z-axis direction.

The image sensing device 4 shown in FIG. 9 comprises the fiber optical block 140, the solid-state image pickup device 220, a substrate 320, and connection wires 420. Among these, constructions of the solid-state image pickup device 220, substrate 320, and connection wires 420 are similar to those of the third embodiment.

The fiber optical block 140 is formed by integrating a plurality of optical fibers 143 arrayed so that the optical axes become substantially parallel to each other. Thereby, the fiber optical block 140 can transmit a two-dimensional image inputted from one end face to the other end face along the optical axes. In FIG. 9 and FIG. 10, out of the two end faces of the fiber optical block 140, an end face located upward in terms of the z-axis direction is provided as a light inputting end face 141, and an end face located downward and opposed to the light inputting end face 141 is provided as a light outputting end face 142. Moreover, the light inputting end face 141 and light outputting end face 142 both have substantially identically formed rectangular shapes.

In FIG. 10, the oblique lines illustrated in a section of the fiber optical block 140 show tilting directions of the optical axes of the optical fibers 143. The light outputting end face 142 is tilted at a predetermined angle θ of an acute angle with respect to the optical axes of the optical fibers 143. Similarly, the light inputting end face 141 is also tilted at an angle θ with respect to the optical axes of the optical fibers 143, and the light outputting end face 142 and light inputting end face 141 are substantially parallel. In addition, a sectional shape of the fiber optical block 140 viewed from the x-axis direction is, as shown in FIG. 10, a substantially rectangular shape whose two sides extending from the light outputting end face 142 to the light inputting end face 141 are substantially vertical to the light outputting end face 142.

In the fiber optical block 140 of the present embodiment, because of the above-described sectional shape, in the light inputting end face 141, a partial region where a light to be transmitted to the light outputting end face 142 is inputted is an input region C4. In addition, in the light outputting end face 142, a partial region where a light inputted from the input region C4 is outputted is an output region B4, and a region excepting the same is a non-output region D4. The input region C4 and output region B4 have rectangular shapes substantially identically formed to each other.

A connecting relationship between the fiber optical block 140 and solid-state image pickup device 220 in the image sensing device 4 shown in FIG. 9 will be described. A light-receiving surface 222e of the solid-state image pickup device 220 is surrounded by four sides of two sides 222a and 222c which are parallel to the x-axis and opposed in the y-axis direction and two sides 222b and 222d which are parallel to the y-axis and opposed in the x-axis direction. Then, the fiber optical block 140 is arranged so that, when viewed from the light-receiving surface 222e, the optical axes of the optical fibers 143 are tilted at the aforementioned angle θ toward the side 222a out of the four sides 222a-222d. Thereby, a tilting direction of the optical axes of the fiber optical block 140 is in a negative direction of the y-axis. Then, in the solid-state image pickup device 220, each of a plurality of electrode pads 221 is arranged on an outer peripheral portion 220b adjacent to a first outer peripheral portion 220a facing the side 222a and an outer peripheral portion 220c opposed to the outer peripheral portion 220a.

Moreover, the output region B4 in the light outputting end face 142 of the fiber optical block 140 and the light-receiving surface 222e of the solid-state image pickup device 220 have in either case a rectangular shape as mentioned above, and these are substantially identically formed to each other. The output region B4 of the light outputting end face 142 and light-receiving surface 222e are connected so that their surfaces substantially coincide with each other. Thereby, a part on the side of the side 222a of the fiber optical block 140 including the non-output region D4 of the light outputting end face 142 is protruded from above the light-receiving portion 222 toward the outer peripheral portion 220a side. In the present embodiment, because of the above-described construction, a whole region A4 of the light-receiving surface 222e becomes an effective region.

Thus, in the image sensing device 4 according to the present embodiment, each of the plurality of electrode pads 221 arranged on the outer periphery of the light-receiving portion 222 is provided not on the first outer peripheral portion 220a positioned in the tilting direction of the optical axes of the optical fibers 143, but on the outer peripheral portion 220b adjacent to the outer peripheral portion 220a and on the outer peripheral portion 220c opposed to the outer peripheral portion 220a. Then, the surfaces of the output region B4 and light-receiving surface 222e are connected so as to substantially coincide with each other, thus resulting in a construction wherein the non-output region D4 is protruded to the outer peripheral portion 220a of the light-receiving portion 222. Thereby, it becomes possible to favorably combine both the electrode pads 221 and connection wires 420 of the solid-state image pickup device 220 and the fiber optical block 140 tilted with respect to the light-receiving surface 222e.

Namely, by applying the above-described construction to the fiber optical block 140 whose sectional shape is a rectangle, it becomes possible to enlarge the effective region A4 of the light-receiving surface 222e.

Fifth Embodiment

Figure 11:
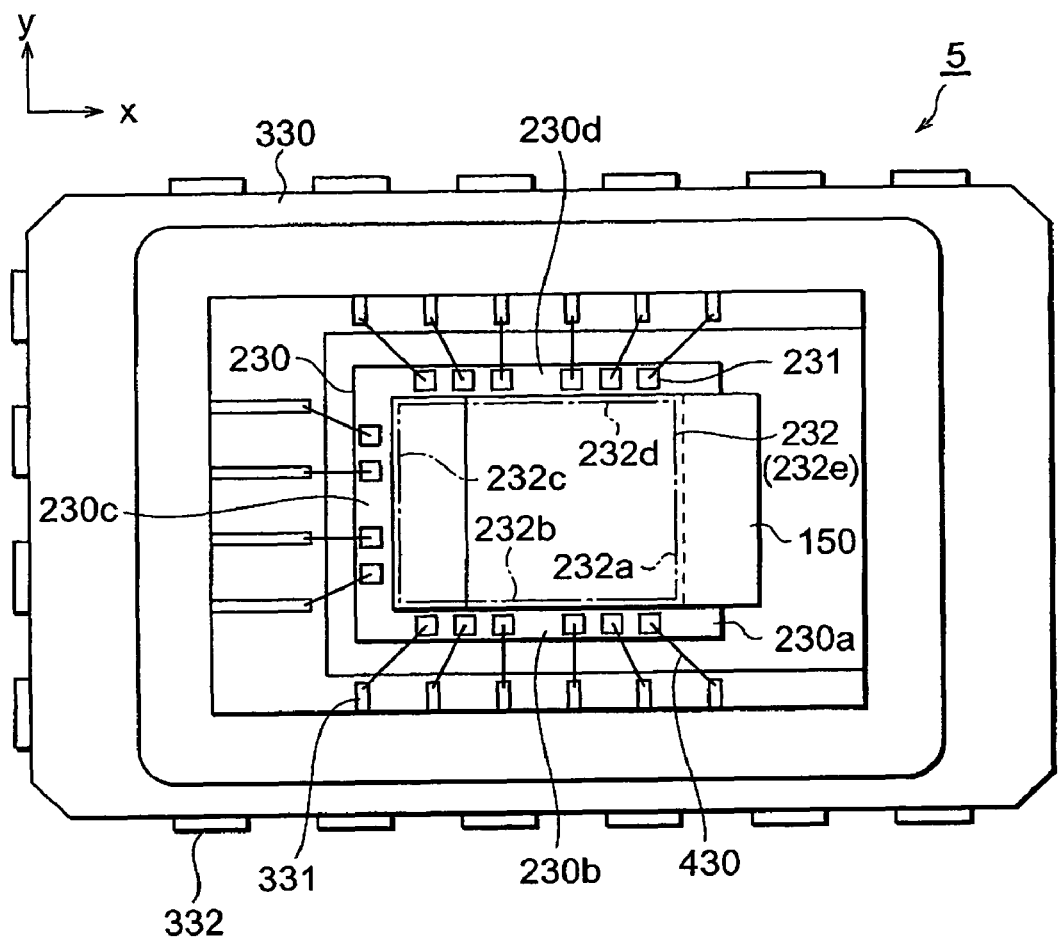
FIG. 11 is a plan view showing an image sensing device according to a fifth embodiment.
Figure 12:
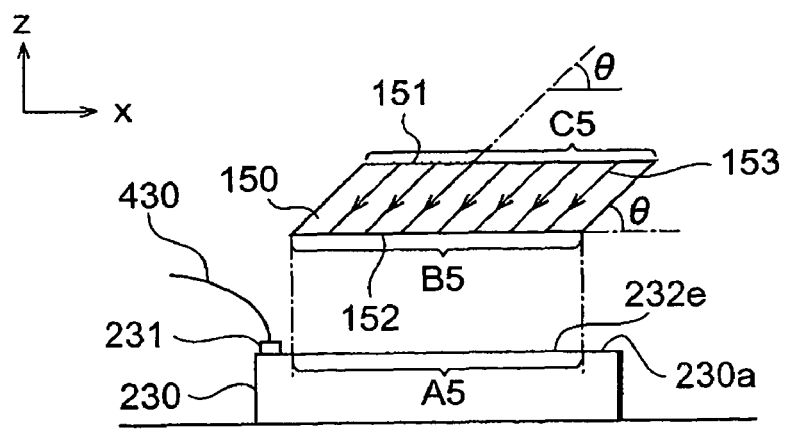
FIG. 12 shows a part of a side sectional view of the image sensing device shown in FIG. 11.

FIG. 11 is a plan view showing an image sensing device according to a fifth embodiment. In addition, FIG. 12 shows a part of a side sectional view of the image sensing device 5 shown in FIG. 11. The side sectional view of FIG. 12 is a sectional view at an xz-plane viewed from the y-axis direction. In addition, in this FIG. 12, a fiber optical block 150 and solid-state image pickup device 230 to be mutually connected are shown in a manner exploded in the z-axis direction.

The image sensing device 5 according to the present embodiment comprises a fiber optical block 150 and a solid-state image pickup device 230 and is constructed so that a two-dimensional image can be detected.

The fiber optical block 150 is formed by integrating a plurality of optical fibers 153 arrayed so that the optical axes become substantially parallel to each other. Thereby, the fiber optical block 150 can transmit a two-dimensional image inputted from one end face to the other end face along the optical axes. In FIG. 11 and FIG. 12, out of the two end faces of the fiber optical block 150, an end face located upward in terms of the z-axis direction is provided as a light inputting end face 151, and an end face located downward and opposed to the light inputting end face 151 is provided as a light outputting end face 152. Moreover, the light inputting end face 151 and light outputting end face 152 both have substantially identically formed rectangular shapes.

In FIG. 12, the oblique lines illustrated in a section of the fiber optical block 150 show tilting directions of the optical axes of the optical fibers 153. The light outputting end face 152 is tilted at a predetermined angle θ of an acute angle with respect to the optical axes of the optical fibers 153. Similarly, the light inputting end face 151 is also tilted at an angle θ with respect to the optical axes of the optical fibers 153, and the light outputting end face 152 and light inputting end face 151 are substantially parallel. In addition, a sectional shape of the fiber optical block 150 viewed from the y-axis direction is, as shown in FIG. 12, a substantially parallelogram shape whose two sides extending from the light outputting end face 152 to the light inputting end face 151 are substantially parallel to the optical axes of the optical fibers 153.

In the fiber optical block 150 of the present embodiment, because of the above-described sectional shape, in contrast to the whole of the light inputting end face 151 as an input region C5, the whole of the light outputting end face 152 becomes an output region B5.

The solid-state image pickup device 230 has a light-receiving portion 232 with a light-receiving surface 232e of a rectangular shape, and with pixels two-dimensionally arrayed along the x-axis direction and y-axis direction. At parts in a surface identical to the light-receiving surface 232e and on its outer periphery, a plurality of electrode pads 231 are provided. Then, the respective portions of the solid-state image pickup device 230 are electrically connected to their respectively corresponding electrode pads 231 by signal lines (unillustrated) In addition, to the light-receiving surface 232e, the above-described light outputting end face 152 of the fiber optical block 150 is optically connected.

The solid-state image pickup element 230, to which the fiber optical block 150 is connected, is placed on a substrate 330. On the substrate 330, at predetermined positions on an outer peripheral side of a surface where the solid-state image pickup device 230 is to be placed, a plurality of internal electrode terminals 331 respectively corresponding to the electrode pads 231 of the solid-state image pickup device 230 are arranged. These internal electrode terminals 331 are electrically connected to external electrode terminals 332 for external connection, which are arranged on side surfaces of the substrate 330, by internal wirings (unillustrated) through the substrate 330. Then, the solid-state image pickup device 230 is placed on the substrate 330 so that the respectively corresponding electrode pads 231 and internal electrode terminals 331 are close together. In addition, each of the mutually corresponding electrode pads 231 and internal electrode terminals 331 is electrically connected by a connection wire 430.

A connecting relationship between the fiber optical block 150 and solid-state image pickup device 230 in the image sensing device 5 shown in FIG. 11 will be described. The light-receiving surface 232e of the solid-state image pickup device 230 is surrounded by four sides of two sides 232a and 232c which are parallel to the y-axis and opposed in the x-axis direction and two sides 232b and 232d which are parallel to the x-axis and opposed in the y-axis direction. Then, the fiber optical block 150 is arranged so that, when viewed from said light-receiving surface 232e, the optical axes of the optical fibers 153 are tilted at the aforementioned angle θ toward the side 232a out of the four sides 232a-232d. Thereby, a tilting direction of the optical axes of the fiber optical block 150 is in a positive direction of the x-axis. Then, in the solid-state image pickup device 230, each of the plurality of electrode pads 231 is arranged on two outer peripheral portions 230b and 230d adjacent to a first outer peripheral portion 230a facing the side 232a and on the outer peripheral portion 230c opposed to the first peripheral portion 230a.

Moreover, the light outputting end face 152 of the fiber optical block 150 and the light-receiving surface 232e of the solid-state image pickup device 230 have in either case a rectangular shape as mentioned above, and these are substantially identically formed to each other. The light outputting end face 152 and light-receiving surface 232e are connected so that their surfaces substantially coincide with each other. In the present embodiment, because of the above-described construction, a whole region A5 of the light-receiving surface 232e becomes an effective region.

Thus, in the image sensing device 5 according to the present embodiment, each of the plurality of electrode pads 231 arranged on the outer periphery of the light-receiving portion 232 is provided not on the first outer peripheral portion 230a positioned in the tilting direction of the optical axes of the optical fibers 153, but on the mutually opposed two outer peripheral portion 230b and 230d adjacent to the outer peripheral portion 230a and on the outer peripheral portion 230c opposed to the first outer peripheral portion 230a. Thereby, it becomes possible to favorably combine both the electrode pads 231 and connection wires 430 of the solid-state image pickup device 230 and the fiber optical block 150 tilted with respect to the light-receiving surface 232e.

Namely, by applying the above-described construction to the fiber optical block 150 whose sectional shape is a parallelogram, contact of the slope part of the fiber optical block 150 protruding from the light-receiving surface 232e to the outer peripheral portion 230a with the connection wires 430 can be avoided. In addition, it is possible to enlarge the effective region A5 of the light-receiving surface 232e.

Sixth Embodiment

Figure 13:
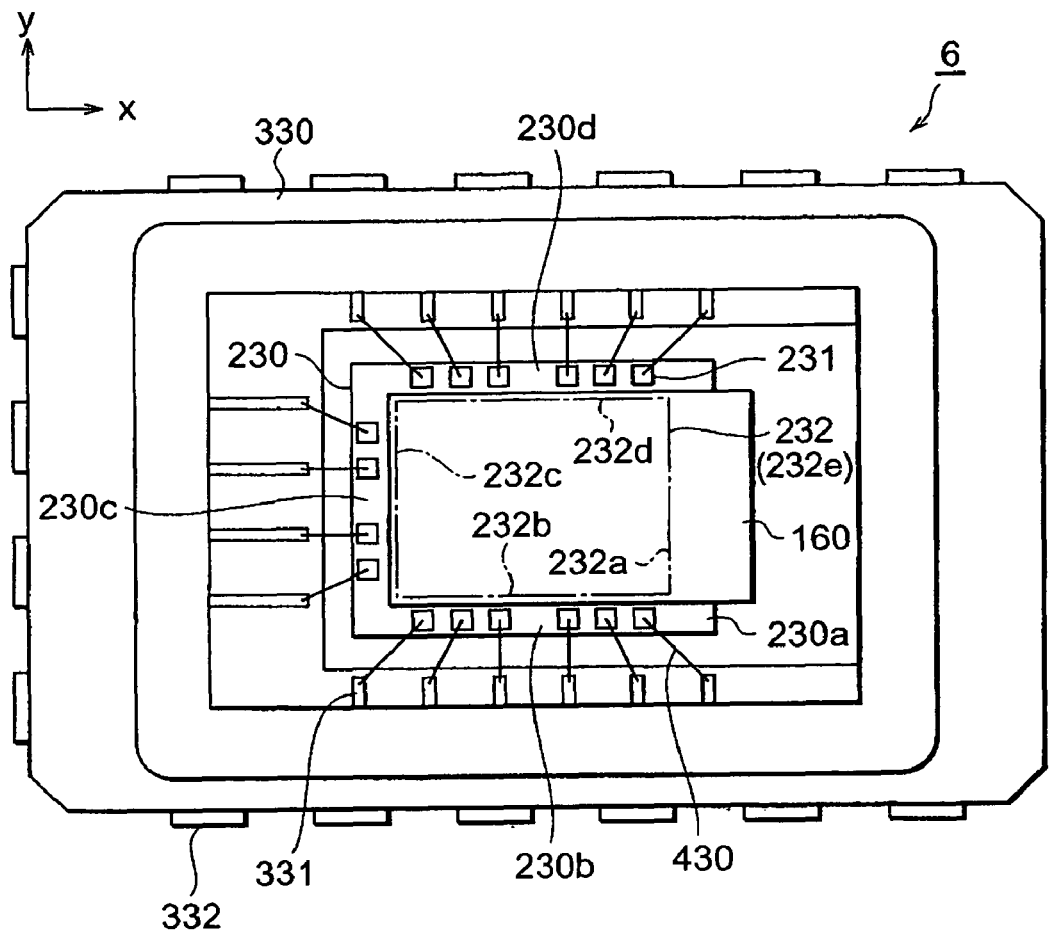
FIG. 13 is a plan view showing an image sensing device according to a sixth embodiment.
Figure 14:
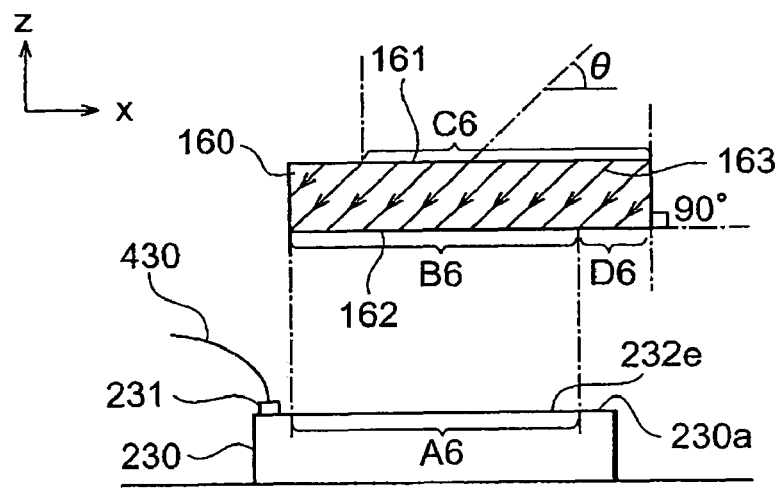
FIG. 14 shows a part of a side sectional view of the image sensing device shown in FIG. 13.

FIG. 13 is a plan view showing an image sensing device according to a sixth embodiment. In addition, FIG. 14 shows a part of a side sectional view of the image sensing device 6 shown in FIG. 13. The side sectional view of FIG. 14 is a sectional view at an xz-plane viewed from the y-axis direction. In addition, in this FIG. 14, a fiber optical block 160 and a solid-state image pickup device 230 to be mutually connected are shown in a manner exploded in the z-axis direction.

The image sensing device 6 shown in FIG. 13 comprises the fiber optical block 160, the solid-state image pickup device 230, a substrate 330, and connection wires 430. Among these, constructions of the solid-state image pickup device 230, substrate 330, and connection wires 430 are similar to those of the fifth embodiment.

The fiber optical block 160 is formed by integrating a plurality of optical fibers 163 arrayed so that the optical axes become substantially parallel to each other. Thereby, the fiber optical block 160 can transmit a two-dimensional image inputted from one end face to the other end face along the optical axes. In FIG. 13 and FIG. 14, out of the two end faces of the fiber optical block 160, an end face located upward in terms of the z-axis direction is provided as a light inputting end face 161, and an end face located downward and opposed to the light inputting end face 161 is provided as a light outputting end face 162. Moreover, the light inputting end face 161 and light outputting end face 162 both have substantially identically formed rectangular shapes.

In FIG. 14, the oblique lines illustrated in a section of the fiber optical block 160 show tilting directions of the optical axes of the optical fibers 163. The light outputting end face 162 is tilted at a predetermined angle θ of an acute angle with respect to the optical axes of the optical fibers 163. Similarly, the light inputting end face 161 is also tilted at an angle θ with respect to the optical axes of the optical fibers 163, and the light outputting end face 162 and light inputting end face 161 are substantially parallel. In addition, a sectional shape of the fiber optical block 160 viewed from the y-axis direction is, as shown in FIG. 14, a substantially rectangular shape whose two sides extending from the light outputting end face 162 to the light inputting end face 161 are substantially vertical to the light outputting end face 162.

In the fiber optical block 160 of the present embodiment, because of the above-described sectional shape, in the light inputting end face 161, a partial region where a light to be transmitted to the light outputting end face 162 is inputted is an input region C6. In addition, in the light outputting end face 162, a partial region where a light inputted from the input region C6 is outputted is an output region B6, and a region excepting the same is a non-output region D6. The input region C6 and output region B6 have rectangular shapes substantially identically formed to each other.

A connecting relationship between the fiber optical block 160 and solid-state image pickup device 230 in the image sensing device 6 shown in FIG. 13 will be described. A light-receiving surface 232e of the solid-state image pickup device 230 is surrounded by four sides of two sides 232a and 232c which are parallel to the y-axis and opposed in the x-axis direction and two sides 232b and 232d which are parallel to the x-axis and opposed in the y-axis direction. Then, the fiber optical block 160 is arranged so that, when viewed from said light-receiving surface 232e, the optical axes of the optical fibers 163 are tilted at the aforementioned angle θ toward the side 232a out of the four sides 232a-232d. Thereby, a tilting direction of the optical axes of the fiber optical block 160 is in a positive direction of the x-axis. Then, in the solid-state image pickup device 230, each of a plurality of electrode pads 231 is arranged on two outer peripheral portions 230b and 230d adjacent to a first outer peripheral portion 230a facing the side 232a and on an outer peripheral portion 230c opposed to the first outer peripheral portion 230a.

Moreover, the output region B6 in the light outputting end face 162 of the fiber optical block 160 and the light-receiving surface 232e of the solid-state image pickup device 230 have in either case a rectangular shape as mentioned above, and these are substantially identically formed to each other. The output region B6 of the light outputting end face 162 and light-receiving surface 232e are connected so that their surfaces substantially coincide with each other. Thereby, a part on the side of the side 232a of the fiber optical block 160 including the non-output region D6 of the light outputting end face 162 is protruded from above the light-receiving portion 232 toward the outer peripheral portion 230a side. In the present embodiment, because of the above-described construction, a whole region A6 of the light-receiving surface 232e becomes an effective region.

Thus, in the image sensing device 6 according to the present embodiment, each of the plurality of electrode pads 231 arranged on the outer periphery of the light-receiving portion 232 is provided not on the first outer peripheral portion 230a positioned in the tilting direction of the optical axes of the optical fibers 163, but on the mutually opposed outer peripheral portions 230b and 230d adjacent to the outer peripheral portion 230a and on the outer peripheral portion 230c opposed to the first outer peripheral portion 230a. Then, the surfaces of the output region B6 and light-receiving surface 232e are connected so as to substantially coincide with each other, thus resulting in a construction wherein the non-output region D6 is protruded to the outer peripheral portion 230a of the light-receiving portion 232. Thereby, it becomes possible to favorably combine both the electrode pads 231 and connection wires 430 of the solid-state image pickup device 230 and the fiber optical block 160 tilted with respect to the light-receiving surface 232e.

Namely, by applying the above-described construction to the fiber optical block 160 whose sectional shape is a rectangle, it becomes possible to enlarge the effective region A6 of the light-receiving surface 232e.

Moreover, an image sensing device according to the present invention is not limited to the embodiments as mentioned above, and various modifications can be made to the present invention. In addition, an image sensing devices of the present invention can be applied to various uses such as, for example, using the same as a fingerprint detector.

With regard to fingerprint detectors, downsizing has been carried out so that their input surfaces have a minimum size required for fingerprint detection, and also, for image sensors for detecting an inputted fingerprint image, carrying out as much downsizing as possible has been demanded. By applying hereto an image sensing device of the present invention, contact between the fiber optical block and connection wires can be avoided and the effective region of the light-receiving surface can be enlarged, therefore, a small-sized fingerprint detector capable of obtaining a high-quality fingerprint image can be realized.

Furthermore, as a type of fingerprint detector, a fingerprint detector by a capacitance detecting method exists. However, the fingerprint detector by a capacitance detecting method has drawbacks such that the same has a low tolerance of electrostatic withstand voltage and difficulty in detecting a fingerprint of a dry finger, and the same easily breaks down. To cope therewith, by employing an image sensing device according to the present invention, the above-described drawbacks of a fingerprint detector by a capacitance detecting method can be solved.

INDUSTRIAL APPLICABILITY

As has been described in detail in the above, an image sensing device according to the present invention can be used as an image sensing device wherein both the solid-state image pickup device and the fiber optical block are favorably combined. Namely, in an image sensing device according to the present invention, the light receiving surface of the solid-state image pickup device and the light outputting end face of the fiber optical block tilted with respect to the optical axes are directly connected so that the tilting direction of the optical axes with respect to the light-receiving surface becomes a direction toward the first side. Moreover, in the solid-state image pickup device, no electrode pads are provided for the light-receiving surface on the first outer peripheral portion facing the first side. Accordingly, it becomes possible to favorably combine both the electrode pads and connection wires of the solid-state image pickup device and the fiber optical block tilted with respect to the light-receiving surface.

What is claimed is:

1. An image sensing device comprising:
   a fiber optical block in which a plurality of optical fibers are arrayed so that their optical axes are parallel to each other, said fiber optical block being formed so that a two-dimensional image inputted from a light inputting end face of said fiber optical block is transmitted to a light outputting end face of said fiber optical block, wherein said light inputting end face and said light outputting end face are parallel to one another and said light outputting end face is tilted at a predetermined acute angle $\theta$ with respect to said optical axes; and
   a solid-state image pickup device having a light-receiving portion with a two-dimensional pixel array, said light-receiving portion having a light-receiving surface optically coupled to said light outputting end face of said fiber optical block, and a plurality of electrode pads arranged on outer peripheral portions of a surface substantially level with said light-receiving surface, wherein
   said fiber optical block has a cuboid shape and is arranged so that, when viewed from a side of said light-receiving surface, said optical axes are tilted at said predetermined angle $\theta$ toward a first side out of four sides surrounding said light-receiving surface, so that said plurality of electrode pads are provided on at least one of three of the outer peripheral portions excluding a first outer peripheral portion located at said first side, and so that no electrode pads are provided on said first outer peripheral portion, and
   wherein said light outputting end face of said fiber optical block has an output region, corresponding to a whole region of said light receiving surface, and a non-output region,
   said light outputting end face of said fiber optical block including the output region and the non-output region is larger than said light-receiving surface, and
   a part on the side of said first side of said fiber optical block including the non-output region of the light outputting end face is protruded from above said light-receiving portion toward said first outer peripheral portion side.

2. The image sensing device as set forth in claim 1, wherein, as viewed from above said light-receiving surface, said plurality of electrode pads are provided on two of the outer peripheral portions, each adjacent to said first outer peripheral portion.

3. The image sensing device as set forth in claim 1, wherein, as viewed from above said light-receiving surface, said plurality of electrode pads are provided on one of the outer peripheral portions adjacent to said first outer peripheral portion and one of the outer peripheral portions opposed to said first outer peripheral portion.

4. The image sensing device as set forth in claim 1, wherein said plurality of electrode pads are provided on at least two of the three outer peripheral portions excluding the first outer peripheral portion.

5. The image sensing device as set forth in claim 1, wherein said plurality of electrode pads are provided on each of the three outer peripheral portions excluding the first outer peripheral portion.

6. The image sensing device as set forth in claim 1, wherein said fiber optical block and said solid-state image pickup device are arranged to configure the image sensing device as a fingerprint detector.

* * * * *